United States Patent
Iyer et al.

(10) Patent No.: US 7,018,938 B2
(45) Date of Patent: Mar. 28, 2006

(54) CONTROLLED USE OF PHOTOCHEMICALLY SUSCEPTIBLE CHEMISTRIES FOR ETCHING, CLEANING AND SURFACE CONDITIONING

(75) Inventors: Subramanyam A. Iyer, Santa Clara, CA (US); Justin K. Brask, Portland, OR (US); Vijayakumar S. Ramachandrarao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 204 days.

(21) Appl. No.: 10/294,266

(22) Filed: Nov. 14, 2002

(65) Prior Publication Data

US 2004/0097076 A1   May 20, 2004

(51) Int. Cl.
*H01L 21/306* (2006.01)
(52) U.S. Cl. .................... 438/746
(58) Field of Classification Search ........... 438/745, 438/746, 788, 789, 795, 796, 1, 7, 8, 9, 14, 438/16, 690, 689, 704, 706–709; 136/21
See application file for complete search history.

(56) References Cited

U.S. PATENT DOCUMENTS

| | | | |
|---|---|---|---|
| 4,544,446 A * | 10/1985 | Cady | 438/689 |
| 5,843,277 A * | 12/1998 | Goto et al. | 216/23 |
| 6,361,646 B1 * | 3/2002 | Bibby, Jr. et al. | 156/345 |
| 6,545,279 B1 * | 4/2003 | Yoshida et al. | 250/341 |
| 6,558,475 B1 * | 5/2003 | Jur et al. | 134/21 |
| 2002/0104269 A1 | 8/2002 | Sun et al. | 51/309 |
| 2003/0012925 A1 * | 1/2003 | Gorrell | 428/137 |

OTHER PUBLICATIONS

Anon, "Metal Etching Process-Uses Spray of Etchant, Oxidixing Solution and Water", RD 330025, 10/1999.*

* cited by examiner

Primary Examiner—Laura M. Schillinger
Assistant Examiner—Jennifer M. Dolan
(74) Attorney, Agent, or Firm—Trop, Pruner & Hu, P.C.

(57) ABSTRACT

Radiant energy may be applied to a photochemically susceptible etching or conditioning solution to enable precise control of the removal of material or alteration of the top surface of a wafer during the fabrication of semiconductor integrated circuits. A particular condition may be detected during the course of photoactivated generation of free radicals or molecular activation to control the further generation of said species by controlling the radiant energy exposure of a wafer.

9 Claims, 2 Drawing Sheets

CONTROLLED USE OF PHOTOCHEMICALLY SUSCEPTIBLE CHEMISTRIES FOR ETCHING, CLEANING AND SURFACE CONDITIONING

BACKGROUND

This invention relates generally to processes for manufacturing semiconductor integrated circuits.

In a number of situations, various materials associated with integrated circuits fabrication may be removed by a process called etching. Etching may involve using chemicals to remove a material from a wafer. Etching may encompass both wet and dry etching and also includes cleaning processes using chemicals to attack materials that are undesirably present on the wafer. Surface conditioning is a process for modifying the top monolayer of a film or substrate (such as converting the surface bonds of silicon from Si—H to Si—OH).

Various etching and cleaning compositions have been formulated to attack etch or clean resistant materials. Many of these approaches are relatively expensive and have only limited efficacy. Selectively removing a particular type of film or residue while leaving underlying or contiguous film(s) intact is a challenge.

For example, the removal of antireflective coatings, photoresist, and sidewall polymers to enable interconnect patterning, is proving to be difficult because of the lack of selectivity of the chemicals used to remove residues. This means that the chemicals used to remove undesirable residues may also attack desired dielectric materials.

Cleaning of residues has typically involved a combination of plasma ash and wet cleans. However, lower dielectric constant films, such as porous carbon doped oxides, are particularly vulnerable to degradation during plasma ash. Thus, with particularly sensitive materials, such as low dielectric constant films, wet cleaning alone is only used to remove the residues. But, of course, using only wet cleaning may prove to have less than ideal efficacy.

Thus, there is a need for better ways to etch materials in semiconductor processes.

DETAILED DESCRIPTION

Figure 1:
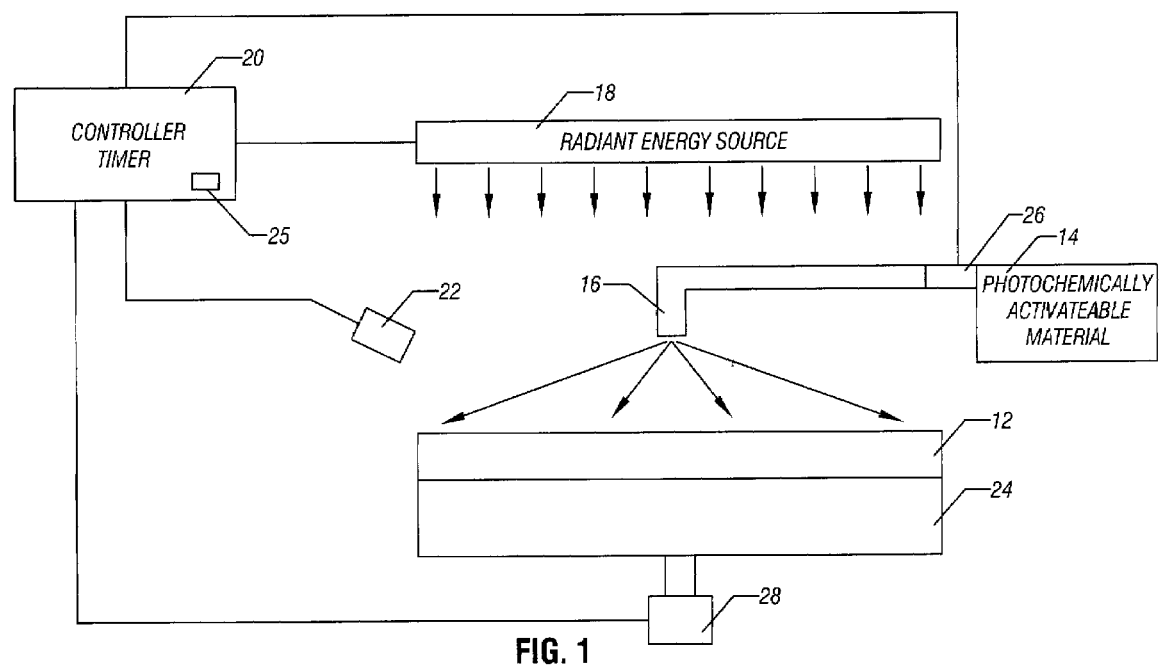
FIG. 1 is a schematic depiction of one embodiment of the present invention.

Referring to FIG. 1, a semiconductor wafer 12 may be mounted on a platen 24. In some cases, the platen 24 may be rotatable. An etching or cleaning material may be dispensed from a tank 14 through a dispersion device 16, such as a nozzle, so as to spread the chemistry over the surface of the wafer 12.

The etching or cleaning or surface conditioning material that is dispensed is advantageously one which is photochemically susceptible. By the term photochemically susceptible, it is intended to refer to a material that forms free radicals or whose molecular bonds are activated when exposed to radiant energy. Examples of the types of radiant energy include ultraviolet energy, which generally may be described as a form of light energy having a wavelength of about 450 nanometers or less, and laser energy. The radiant energy has the effect of initiating free radical formation or activating molecular bonds. The activated molecular bonds or free radicals may be particularly effective in attacking undesirable materials, such as residues, or in removing films/features from semiconductor structures in conventional etch processes.

Thus, a radiant energy source 18 may be positioned in close proximity to the wafer 12 so as to irradiate the surface of the wafer 12. The light exposure must be direct and close to the wafer surface since radical formation or molecular bond activation is quickly reverted and the energy is quickly dissipated as heat.

Because the formation of free radicals or activated molecules may be particularly effective in removing materials, it is very important to precisely control the generation of such species. To this end, a controller or timer 20 may control the operation of the radiant energy source 18 to precisely determine the desired operation of the source 18 and its effect on constituents in the wafer 12. Moreover, an end point detector 22 may also be coupled to the controller or timer 20 to provide further feedback that assists in controlling the duration and/or intensity of the source 18. The controller or timer 20 may also control the operation of a valve 26 to control the flow of photochemically susceptible material from the tank 14. The controller 20 may also control the rotation of the platen 24 by a motor 28, including controlling the platen rotation speed.

In some embodiments, the controller or timer 20 may be a processor-based system that may be programmed to precisely control the application of the radiant energy by the source 18.

To this end, the controller 20 may control the duration of operation of the source 18 in one embodiment. As another example, the controller 20 may reduce its power to a lower level for a period of time before totally shutting off the energy source 18.

Without close control of the source 18, the source 18 may generate species that attack constituents on the wafer 12 that should not be affected by the etching or cleaning process. Thus, by using photochemically susceptible species with the controller 20 and detector 22, the etching/cleaning operation may be precisely controlled. Many of the activated species have lifetimes much shorter than a second, allowing essentially instantaneous control of these photo generated species.

Suitable photochemically susceptible compounds, in some embodiments, include substituted benzenes, such as $C_6H_5$—R, where R may be hydrogen, chlorine, hydroxide, OMe, CN, carboxylic acid, $NH_2$, CHO, or $NO_2$, as examples, together with chromophores that have energy levels in the ultraviolet range. Ketones are a class of solvents that undergo photolytic cleavage in the presence of ultraviolet light to form free radicals.

Other photochemically susceptible compounds include alkylhalides, azo compounds, aldehydes, and amines. Specific examples include acetone, alkyl iodides, azomethane, acetaldehyde, and methylamine. In some cases, the photochemically susceptible compounds may include other compounds that produce radicals such as hydrogen peroxide or titanium oxide.

The control over the effect of the radiation on these photochemically susceptible compounds may include increasing or decreasing radiation intensity, increasing or decreasing radiation wavelength, increasing or decreasing the area exposed to radiation when the wafer 12 is being rotated, or moderating the duration of the radiation exposure.

The end point detector 22 may include a sensor that detects chemical by-products from the reaction with the target material to be removed. For example, a drop in concentration of the reaction by-product signals that most of the material to be removed has been removed. Thus, the end point detector 22 may include a sensor that is electrochemical or spectroscopy based. As another example, the detector 22 may be an optical detector that picks up the removal of the undesired material from the wafer 12. In particular, because the underlying surface becomes more visible, the resulting reflectivity of the upper surface may be detected.

Figure 2:
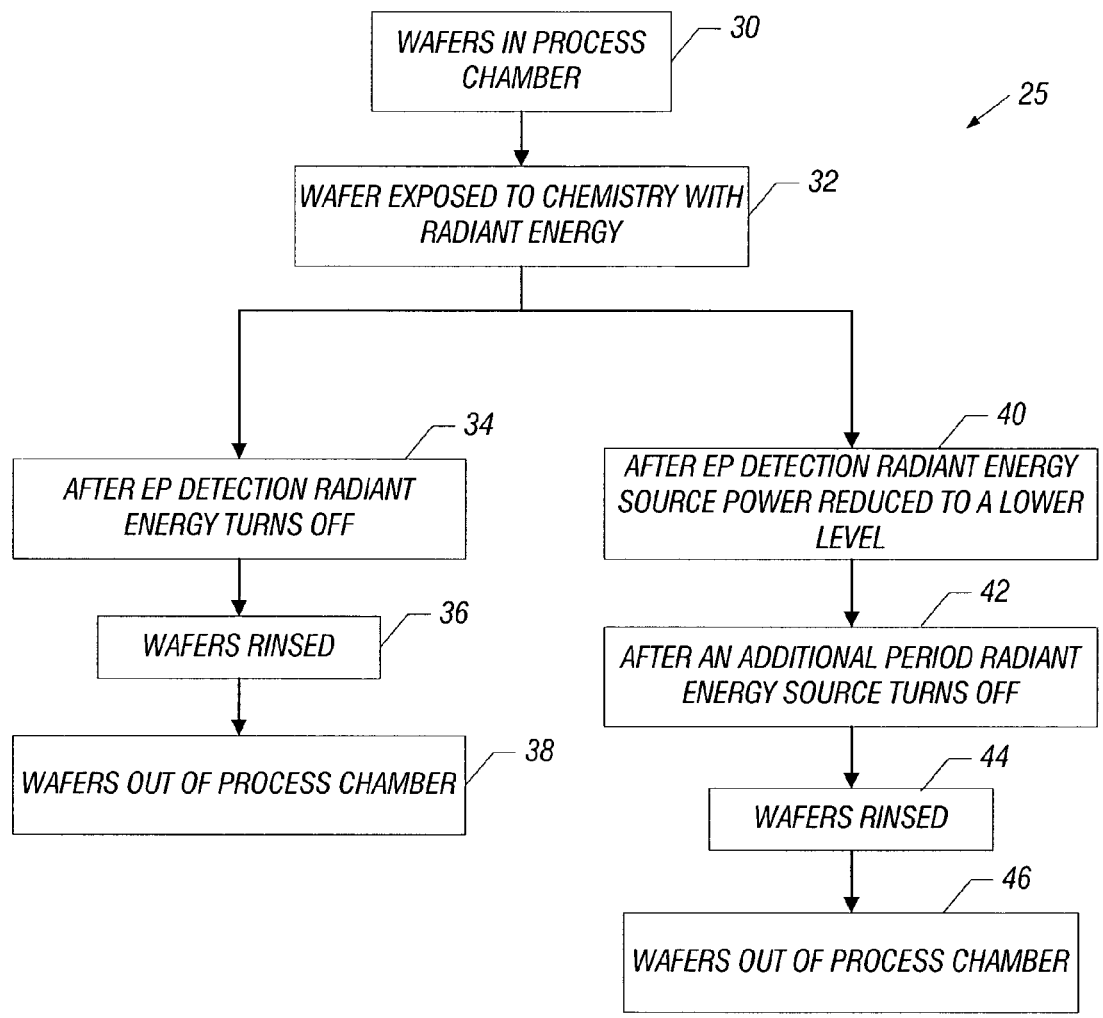
FIG. 2 is a flow chart for another embodiment of the present invention.

Referring next to FIG. 2, the control over the radiation exposure may be in accordance with manual or automatic processes, including those under control of programmed equipment. Thus, in some embodiments, software may be utilized to control the operation of such radiant energy cleaning or etching systems. In such case, the flow, shown in FIG. 2, may be a software flow and software 25 responsible for implementing the flow may be stored in an appropriate storage device on the controller timer 20 (FIG. 1), in one embodiment of the present invention. However, the present invention is not limited to software techniques for implementing the etching and cleaning processes and may also encompass automatic techniques implemented in hardware or logic as another example.

Initially, the wafer or wafers 12 may be placed in a process chamber as indicated in block 30 in FIG. 2. The wafers coupled with the desired photochemically susceptible compound, applied via the dispersion device 16, may be automatically exposed to the radiant energy source 18 as indicated in block 32. In some cases, after a certain elapsed time or the detection of an appropriate end point by the detector 22, the radiant energy may be terminated as indicated in block 34. Thereafter, the wafers may be automatically rinsed, as indicated in block 36, and then the wafers may be removed from the process chamber as indicated in block 38.

Alternatively, as appropriate, after a certain amount of time, or upon detection by the detector 22 of an appropriate end point, the radiant energy source power may be reduced to a lower level as indicated at block 40. Then after an additional period the radiant energy source may be turned off as indicated in block 42. Subsequently, the wafers may be rinsed, as indicated in block 44, and processed out of the chamber as indicated in block 46.

Thus, in some embodiments of the present invention, very controllable chemical reactions may be initiated to remove components that need to be etched or cleaned from wafers. In some cases, the etching process may continue within the chamber for a period of time and only a subset of that time may involve the use of photochemically susceptible components. This precise control allows the protection of sensitive materials, such as carbon doped oxides, and low dielectric constant materials that may also be present on the wafer 12.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   exposing a semiconductor wafer having a photochemically susceptible solution thereon to radiation having a first characteristic;
   detecting a condition related to radiation exposure on said wafer while exposing said wafer to radiation having said first characteristic; and
   altering the first characteristic of the radiation in response to the detection of said condition and continuing the exposure of said wafer to radiation having an altered, second characteristic.

2. The method of claim 1 wherein detecting a condition includes detecting the reflectivity of a surface of the wafer.

3. The method of claim 1 wherein detecting a condition includes detecting chemical species associated with said wafer.

4. The method of claim 3 wherein detecting a condition includes detecting chemical species in solution surrounding said wafer.

5. The method of claim 1 wherein exposing the wafer to radiation includes exposing the wafer to ultraviolet radiation.

6. The method of claim 1 wherein applying a photochemically susceptible solution to said wafer includes applying a substituted benzene solution to said wafer.

7. The method of claim 1 wherein applying a photochemically susceptible solution includes applying a ketone containing solution to said wafer.

8. The method of claim 1 wherein altering the exposure to radiant energy includes varying the intensity of the radiant energy.

9. The method of claim 1 wherein altering the exposure to radiant energy includes varying the wavelength of the radiant energy.

* * * * *